United States Patent [19]

Fujita

[11] Patent Number: 5,159,339
[45] Date of Patent: Oct. 27, 1992

[54] SAMPLING RATE CONVERTER FOR SIGNALS HAVING A NON-INTEGER SAMPLING RATIO

[75] Inventor: Tadao Fujita, Kanagawa, Japan
[73] Assignee: Sony Corporation, Tokyo, Japan
[21] Appl. No.: 695,713
[22] Filed: Feb. 15, 1991

[30] Foreign Application Priority Data

Feb. 19, 1990 [JP] Japan .................. 2-39010

[51] Int. Cl.$^5$ .............................................. H03M 7/00
[52] U.S. Cl. ......................................... 341/61; 358/11
[58] Field of Search ...................... 341/50, 61; 358/11, 358/133, 138

[56] References Cited

U.S. PATENT DOCUMENTS

| | | | |
|---|---|---|---|
| 4,630,034 | 12/1986 | Takahashi | 341/61 |
| 4,903,019 | 2/1990 | Ito | 341/61 |
| 4,989,091 | 1/1991 | Lucas | 358/140 |

FOREIGN PATENT DOCUMENTS

| | | |
|---|---|---|
| 305864 | 3/1988 | European Pat. Off. . |
| 336669 | 10/1989 | European Pat. Off. . |
| 3304006 | 3/1984 | Fed. Rep. of Germany . |

*Primary Examiner*—Marc Hoff
*Attorney, Agent, or Firm*—Alvin Sinderbrand; William S. Frommer

[57] ABSTRACT

In a sampling rate converter which converts a sampling frequency of digital signals sampled at a first sampling frequency into a second sampling frequency, output clocks corresponding to the second sampling frequency are counted in a cyclic fashion from an initial value to a maximum value based on periodicity of the first and second sampling frequencies. Coefficient addresses are generated in accordance with the resulting count value and a coefficient correction value which is determined in accordance with the number of counts of the maximum value and the periodicity of the first and second sampling frequencies, the number of counts of the maximum value being the number of times the output clocks are counted to the maximum value. The sampling frequency of digital signals sampled at the first sampling frequency is thus converted into the second sampling frequency with a simple construction of counting to the maximum value in accordance with the periodicity of the sampling frequencies.

6 Claims, 6 Drawing Sheets

SAMPLING RATE CONVERTER FOR SIGNALS HAVING A NON-INTEGER SAMPLING RATIO

BACKGROUND OF THE INVENTION

The present invention relates to a sampling rate converter, and is suitably applied to the case where a sampling frequency of component digital video signals based on the D-1(625/50) format is converted to a sampling frequency corresponding to composite digital video signals based on the D-2 format, for example.

Heretofore, a commonly employed sampling rate converter was comprised of a digital filter for converting digital signals, which are obtained by sampling analog signals at a predetermined frequency, to an arbitrary sampling frequency.

Such a sampling rate converter was constituted by a high order oversampling filter to strictly observe the Nyquist frequency as a conversion characteristic of the transmission system.

In FIGS. 1A-1D, there is roughly illustrated an operation of a sampling rate converter constructed by an oversampling filter. In such an oversampling filter, input digital signals (indicated by character ∘ in FIG. 1A) are inputted to the oversampling filter, the input digital signals being provided by sampling analog signals $S_{VT}$ as shown in FIG. 1A at a first sampling frequency $f_1$ (FIG. 1B).

Subsequently, the oversampling filter oversamples input digital signals at a frequency $f_{11}$ 11 times larger than the frequency $f_1$, as shown in FIG. 1C as well as resampling them at a second sampling frequency $f_2$ (FIG. 1D) to obtain output digital signals which have values indicated by characters □ in FIG. 1A and are rate converted into frequency $f_2$.

When a sampling frequency of component digital video signals based on the D-1 (625/50), format in a digital video tape recorder (DVTR) is converted into a sampling frequency corresponding to PAL composite digital video signals based on the D-2 (PAL) format, it is not practically possible to directly convert the sampling frequency between digital video signals since the sampling frequency must be converted from a frequency of 13.5 MHz to a frequency of 17.734475 MHz. By reason of the foregoing, it would be necessary to build an oversampling filter having approximately a length of an order of about 16,500.

Also in the converse case where a sampling frequency of PAL composite digital video signals is converted into a sampling frequency corresponding to 625/50 component digital video signals, it would be necessary to build an oversampling filter in the same circuit scale as the above described case since the sampling frequency is rate converted from a frequency of 17.734475 MHz to a frequency of 13.5 MHz. It is thus inevitable that the overall circuit scale becomes complicated and large.

To solve such a problem, a sampling rate converter has been proposed in which an oversampling filter reducing the circuit scale is built as follows. On the basis of the relationship of the sampling frequencies of 13.5 MHz and 17.734475 MHz for 625/50 component digital video signals and PAL composite digital video signals, an oversampling frequency is set, and then, changeable filter coefficients are input to multipliers, thus resulting in a magnification of the oversampling for weighting the sampling data.

FIG. 2 illustrates a basic construction of a sampling rate converter 1 having changeable coefficients. In the case where in a sampling rate converter 1 as shown in FIG. 2, a sampling frequency corresponding to 625/50 component digital video signals is converted into a sampling frequency corresponding to PAL composite digital video signals, for example, 625/50 component digital video signals $S_{IND1}$ and output clock pulse signals $CK_{D1}$ corresponding to the sampling frequency thereof are supplied as input to the timing adjusting circuit 2.

This timing adjusting circuit 2 causes data of the 625/50 component digital video signals $S_{IND1}$ which were input at the rate of the clock pulse signals $CK_{D1}$ to be output at the timing of the rate of the clock pulse signals $CK_{D2}$ so as to convert the clock pulse frequency as well as control the timing of the data transference described below.

In addition to this, frame pulses $P_{FD1}$ corresponding to one frame of the 625/50 component digital video signals $S_{IND1}$ are supplied as input to reset terminals of a phase locked loop (PLL) circuit 3 and a counter 4.

The output of the PLL circuit 3 is fed back through a frequency divider 5 with a dividing ratio ($=1/709379$) corresponding to the number of samples of one frame ($=709,379$) of PAL composite digital video signals.

This enables the PLL circuit 3 to correctly synchronize with frame pulses $P_{FD1}$ of the 625/50 component digital video signals, and the PLL circuit 3 generates output clock pulse signals $CK_{D2}$ corresponding to the sampling frequency of the PAL composite digital video signals and supplies them to a count input terminal of a counter 4, the timing adjusting circuit 2 and an oversampling filter 6.

The counter 4 is reset by the frame pulses $P_{FD1}$, and counts the output clock pulse signals $CK_{D2}$, received from the PLL circuit 3, for each frame. Consequently, count data $D_{CNT}$ which ranges in value from zero to 709,378 is sequentially sent to a coefficient address control circuit 7.

The coefficient address control circuit 7 generates coefficient address data $D_{COE}$ according to the count data $D_{CNT}$ to read coefficients $C_{OEFA}$, $C_{OEFB}$, ... from coefficient generating circuits 9A, 9B, ... which are implemented as ROM devices (read only memories), the coefficients $C_{OEFA}$, $C_{OEFB}$, ... being fed to multipliers 8A, 8B, ... which are weighting means of the oversampling filter 6, part of which is illustrated in FIG. 3.

The relationship between coefficients $C_{OEFA}$, $C_{OEFB}$, ... supplied to the multipliers 8A, 8B, ... and the coefficient address data $D_{COE}$ is illustrated schematically in FIG. 4. In FIG. 4, a longitudinal axis represents the coefficient $C_{OEF}$ and lateral axis represents the coefficient address data $D_{COE}$. The lateral axis may also be seen as a time axis. "N" is the order of the oversampling filter and is derived from the characteristic of the oversampling filter required. An impulse response characteristic of the oversampling filter is formed by N groups of the coefficient $C_{OEF}$. It is to be appreciated that the impulse response characteristic is only schematically illustrated in FIG. 4.

"M" represents the numbers of the divisions between sampling points of the input signal $S_{IND1}$, that is, the resolution capability, by which the oversampling frequency is decided. The coefficients are divided into groups of M, so as to store them in the coefficient generating circuits 9A, 9B, ... the number of which are N/M. The coefficient address data $D_{COE}$ is generated at the rate of the clock pulse signals $CK_{D2}$ in the coefficient address control circuit so that the appropriate coefficients $C_{OEF}$ stored in circuits 9A, 9B, ... are read out.

The relationship between the count data $D_{CNT}$ and the address to be supplied to the coefficient generating circuits 9A, 9B, ... containing the coefficient address data $D_{COE}$ is illustrated in FIG. 5. In the case illustrated in FIG. 5, the oversampling filter is constructed with orders N=4554, M=506. The coefficients which form the impulse response characteristic of the oversampling filter are stored in sequence at the addresses from $a_0$, $b_0$, ... $i_0$ to $a_{505}$, $b_{505}$, ... $i_{505}$. In the lower portion of FIG. 5, the coefficient addresses $D_{COE}$ which are generated at the time of each value of the count data $D_{CNT}$ are illustrated. In FIG. 5, with the count data $D_{CNT}$ sequenced through the values n, n+1, n+2, ... at the rate of the clock pulse signals $CK_{D2}$, the coefficient address data $D_{COE}$ is generated so that the addresses occur in the sequence [$a_0$, $b_0$, $c_0$, ...], [$a_{386}$, $b_{386}$, $c_{386}$, ...], [$a_{266}$, $b_{266}$, $c_{266}$, ...], ....

The generation of the address in the coefficient generation circuit is performed on the basis of the relationship between the sampling period of the 625/50 component digital video signal and the sampling period of the PAL composite digital video signal so as to shift by 386 addresses cyclicly among addresses 0–505 as results from the following equation.

$$506 \cdot \frac{13.5}{17.7} = 386 \quad (1)$$

The coefficients $C_{OEFA}$-$C_{OEFI}$ generated in the coefficient generating circuits 9A–9I are multiplied by the output data in the multiplier. However, when the count data $D_{CNT}$ reaches certain predetermined values, for instance $D_{CNT}$ becoming $D_{CNT}=n+1$ in FIG. 5, it is necessary to multiply the coefficients corresponding to $D_{CNT=n+1}$ by the same data as the flip-flop output data which was multiplied at the time when $D_{CNT}$ was=n. In this case, the coefficient address control circuit 7 generates a shift control signal $D_{SFT}$ to stop the data transference in the flip-flop circuits 10A–10I (this data transference normally being to shift one block of data) so as to allow the multiplier to use the same flip-flop output data.

The shift control signal $D_{SFT}$ also is provided to the timing adjusting circuit 2. This results in temporarily stopping the conversion of the clock along with the stopping of the operation of the data transference from the flip-flop circuits 10A–10I, whereas the conversion of the clock pulse frequency would otherwise continue in the timing adjusting circuit 2.

As described above, the timing adjusting circuit 2 adjusts the timing of the 625/50 component digital video signals $S_{IND1}$ input as sent to the oversampling filter 6 according to the output clock pulse signals $CK_{D1}$, the output clock pulse signals $CK_{D2}$, and the shift control data $D_{SFT}$.

The oversampling filter 6 performs oversampling by multiplying the 625/50 component digital video signals $S_{IND1}$ thus received by coefficients $C_{OEFA}$, $C_{OEFB}$, ... according to the shift control data $D_{SFT}$ and the coefficient address data $D_{COE}$, and provides its output according to output clock pulse signals $CK_{D2}$. In this manner, output digital video signals $S_{OUTD2}$ are obtained by converting the sampling frequency of 625/50 component digital video signals to a sampling frequency of PAL composite digital video signals.

It is to be noted that in the oversampling filter 6, input digital signals $S_{IN}$ are fed to a series of circuit flip-flops 10A, 10B, ... each having a delay resulting from the output clock pulse signals $CK_{D2}$. Delayed digital signals sent out from each of the flip-flops 10A, 10B, ... are input to subsequent flip-flops 10B, ... and to corresponding multipliers 8A, 8B, ....

Predetermined coefficients $C_{OEFA}$, $C_{OEFB}$, ... as described above are input from the coefficient generating circuits 9A, 9B, ... to their respective multipliers 8A, 8B, ..., and consequently, the delayed digital signals are multiplied by the respective coefficients $C_{OEFA}$, $C_{OEFB}$, ....

Results of the multiplication are then input to each of the adders 11A, 11B, ... for providing a total, and the result of this addition is sent out as output digital video signals $S_{OUT}$.

The sampling rate converter 1 with such a construction results in a large scale circuit configuration in which the counter 4 counts values from 0 to 709378. Also, the coefficient address control circuit 7 inevitably has a large scale circuit configuration for processing the count data $D_{CNT}$ from the counter 4. Consequently, there is a problem in that the sampling rate converter 1 becomes large.

SUMMARY OF THE INVENTION

Accordingly, it is an object of this invention to provide a relatively simple and compact sampling rate converter which is capable of converting a sampling frequency of digital signals sampled at a first sampling frequency to a second sampling frequency.

In accordance with a first aspect of this invention, there is provided in a sampling rate converter for converting a sampling frequency of digital signals sampled at a first sampling frequency to a second sampling frequency, the sampling rate converter including an oversampling filter having coefficient generation means for generating coefficients to be provided to weighting means according to coefficient addresses, the combination of: counting means for counting output means for generating clock pulses at the second sampling frequency; counting means for generating count data by counting, in response to the clock pulses, in a cyclic fashion; correction value generation means for generating a coefficient correction value in accordance with the number of times the counting means counts to a maximum value, the value chosen as the maximum value, and the first and second sampling frequencies; and coefficient address generation means for generating the coefficient addresses in accordance with the value of the count data and the coefficient correction value generated by the correction value generation means.

In the foregoing construction, output clock pulses corresponding to the second sampling frequency cause counting in cyclic fashion from the initial value to the maximum value based on periodicity of the first and second sampling frequencies, and coefficient addresses are generated in accordance with the resulting count value, while the coefficient correction value is generated in accordance with the number of times the maximum value is counted, the value chosen as the maximum value, and the first and second sampling frequencies. The sampling frequency of digital signals sampled at a first sampling frequency is thus converted to a second sampling frequency with an apparatus of simple construction for repeatedly counting from the initial value to the maximum value.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
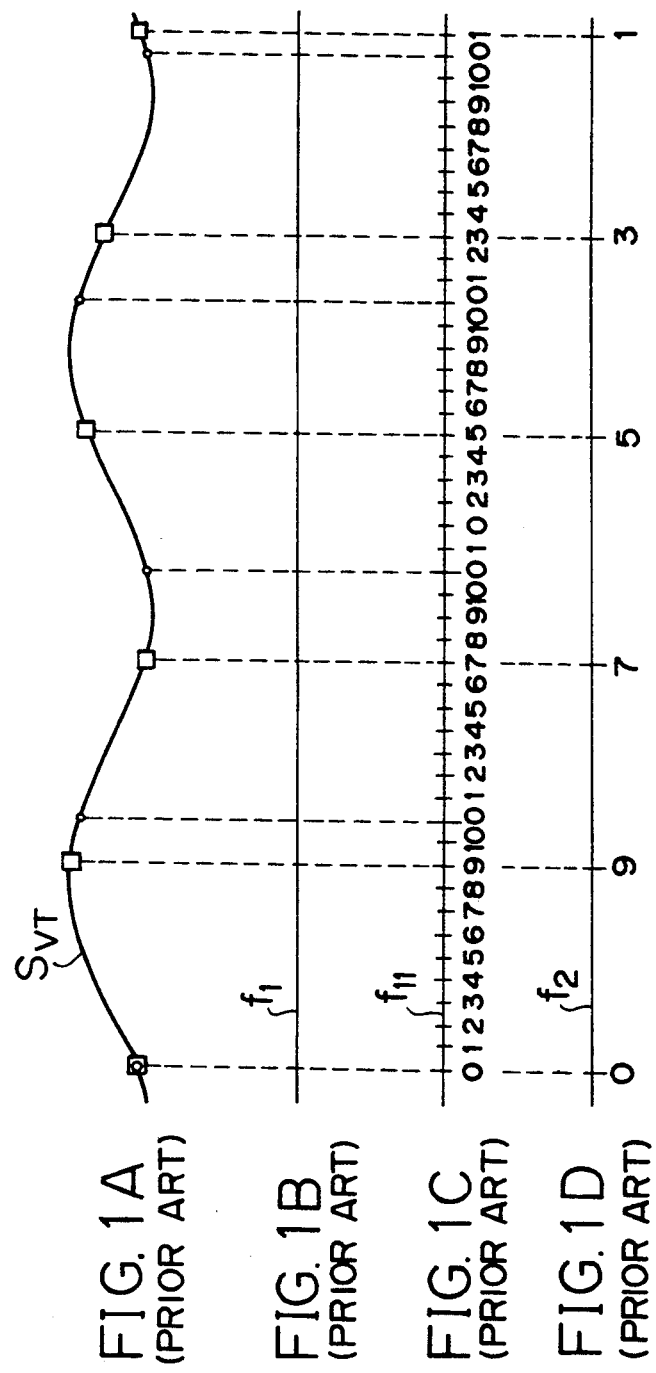
FIGS. 1A to 1D are timing charts illustrating the oversampling operation.

Preferred embodiments of this invention will be described with reference to the accompanying drawings:

(1) Principle of the Preferred Embodiment

In a sampling rate converter of this embodiment, the sampling frequency of component digital video signals based on the D-1(625/50) format in a digital video tape recorder (DVTR) is converted to a sampling frequency corresponding to PAL composite digital video signals based on the D-2(PAL) format.

In practice, the sampling frequency of component digital video signals based on the D-1(625/50) format is defined to be 13.5 MHz, and the number of samples per line of digital video signals is hence 864. The total number of samples of one frame amounts to 540,000.

The sampling frequency of PAL composite digital video signals based on the D-2(PAL) format is 17.734475 MHz which is four times the sub-carrier frequency $f_{SC}$ calculated based on the following equation, provided the horizontal frequency $f_h$ is 15.625 KHz:

$$f_{SC} = \left(284 - \frac{1}{4}\right)f_h + \frac{50}{2} \qquad (2)$$
$$= 4.43361875 \text{ (MHz)}$$

Accordingly, the number of samples per line of digital video signals is 1135.0064, and the total number of samples of one frame is 709379.

As described, the ratio of the number of samples per line of the D-1 625/50 component digital video signals to the number of samples per line of the D-2 format or PAL composite digital video signals is 864:1135.0064, and it is clear that this ratio does not have an appropriate integer relationship.

When a sampling frequency is converted using an oversampling filter with a sufficient length, the oversampling filter may be of a coefficient switch type construction. In this case, the combination of coefficients given to the oversampling filter must correspond to the phase between the pre-conversion sampling frequency and the post-conversion sampling frequency.

As already pointed out, there is no relatively small integer ratio between the pre-conversion sampling frequency and the post-conversion sampling frequency, and it is hence necessary to count sampling points per frame so as to generate a coefficient corresponding to the count value.

The sampling cycle of 625/50 component digital video signals is computed from the following equation:

$$\frac{1}{13.5 \text{ (MHz)}} = 74.074074 \text{ (nsec)} \qquad (3)$$

The sampling cycle of PAL composite digital video signals is computed from the following equation:

$$\frac{1}{17.734475 \text{ (MHz)}} = 56.38734724 \text{ (nsec)} \qquad (4)$$

By detecting the time difference between the sampling point corresponding to the sampling frequency of 625/50 component digital video signals and the sampling point corresponding to the sampling frequency of PAL composite digital video signals from the top of a frame, the number of samples of the 625/50 component digital video signals becomes the value given by the equation below at a time equivalent to the counting of 423 samples of PAL composite digital video signals counted from the top of the frame:

$$\frac{56.38734724 \text{ (nsec)} * 423}{74.074074 \text{ (nsec)}} = 321.9999464 \qquad (5)$$

Thus, at this time point the number of sampling points of both formats becomes very close to integers.

Sampling points of the sampling cycles of 625/50 component digital video signals and PAL composite digital video signals become close every multiple of 322 and 423 sample points, respectively.

In this embodiment of the invention, coefficient addresses and the data shift control need only be generated for 423 sample points with reference to the sampling cycle of the PAL composite digital video signals. In addition, a time correction given by the equation below is performed every 423 sample points at the sampling cycle of the PAL composite digital video signals.

$$56.38734724 \text{ (nsec)} \times 423 - 74.074074 \text{ (nsec)} \times 322 = \qquad (6)$$
$$-0.00396796 \text{ (nsec)}$$

In phase shifting and the generation of coefficients, the correction above described is carried out by providing a counter which counts sampling within a small range between 423 sample points. This enables the sampling frequency to be converted at a high accuracy with a simple construction.

(2) Sampling Rate Converter of the preferred Embodiment

Figure 2:
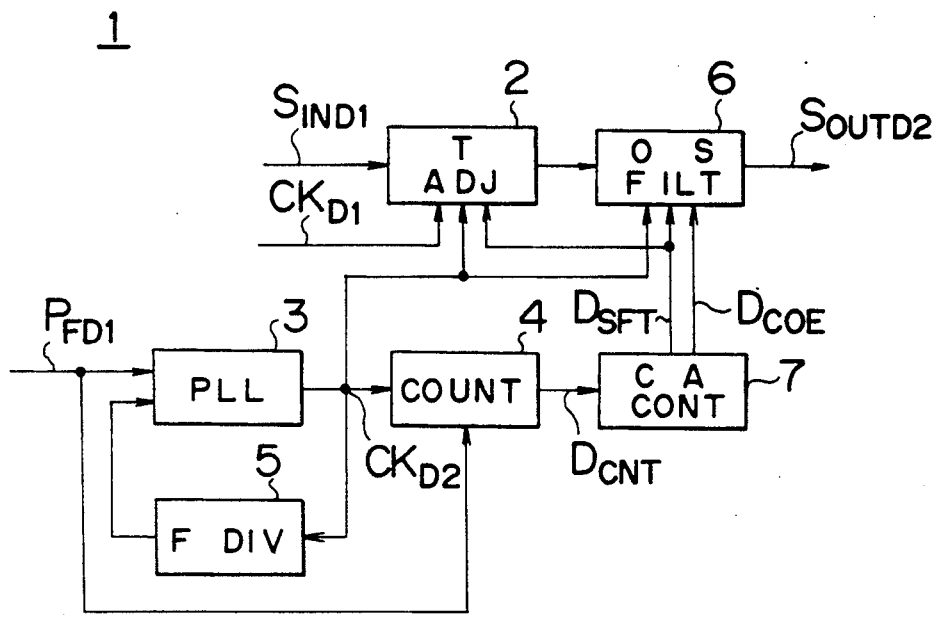
FIG. 2 is a block diagram showing a conventional sampling rate converter.
Figure 6:
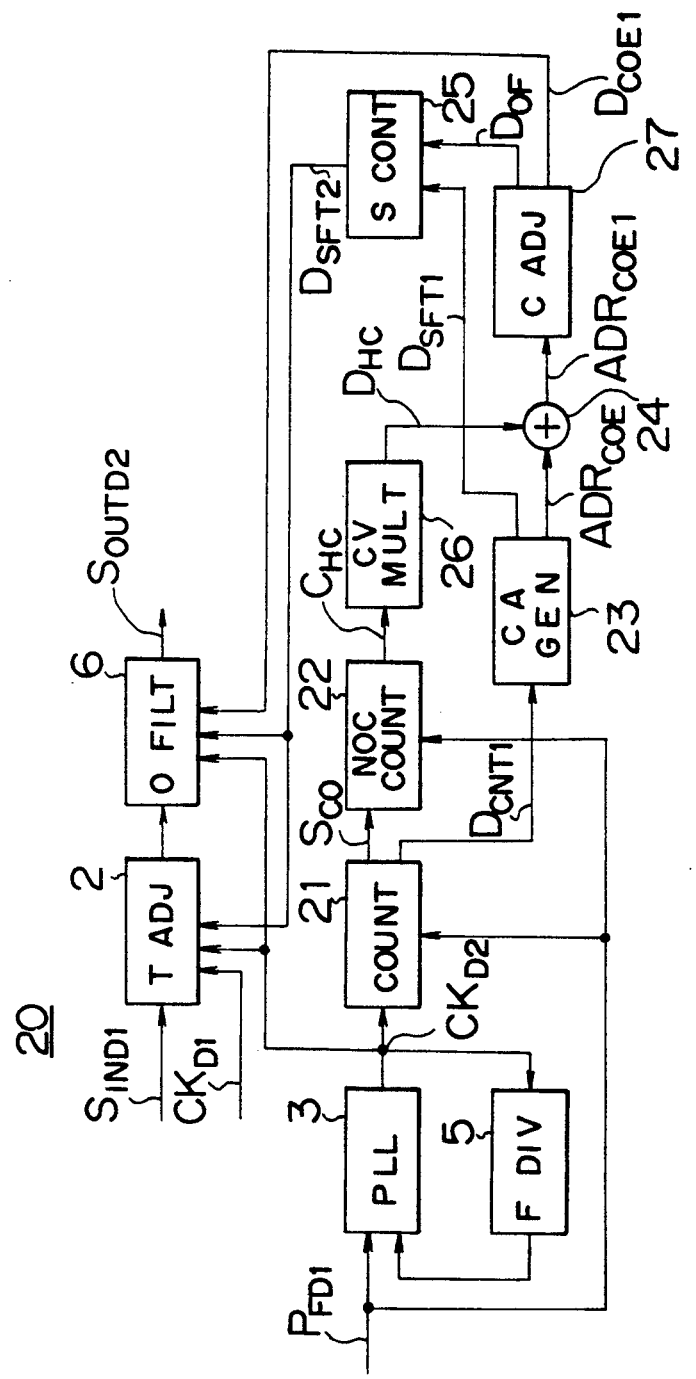
FIG. 6 is a block diagram showing one embodiment of the sampling rate converter according to this invention.

In FIG. 6, in which parts corresponding to those described with reference to FIG. 2 are given the same reference numerals, 20 generally designates a sampling rate converter which, for example, converts a sampling frequency of 625/50 component digital video signals to a sampling frequency of PAL composite digital video signals. In this embodiment, frame pulses $P_{FD1}$ which correspond to each frame of 625/50 component digital video signals $S_{IND1}$ are input to a PLL circuit 3, a reset input terminal of a counter 21, and a reset terminal of a number-of-corrections counter 22.

The counter 21 is adopted in place of the conventional counter 4 which counts to 709,378 and is designed to respond to output clock pulse signals $CK_{D2}$ by counting in a cyclic manner from zero to 422 on the basis of the principle stated in connection with equations (3) to (6) above during one frame of 625/50 component digital video signals $S_{IND1}$.

The counter 21 thus counts in response to output clock pulse signals $CK_{D2}$ during one frame. The counter 21 sends resulting count data $D_{CNT1}$ the value of which ranges from zero to 422, to a coefficient address generation circuit 23, and also sends a carry signal $S_{CO}$, which is generated every time the counted value exceeds 422, to the correction frequency counter 22.

The coefficient address generation circuit 23 generates a coefficient address $ADR_{COE}$ and shift data $D_{SFT1}$ (this signal has the same functions as the shift control signal $D_{SFT}$, in sampling rate converter 1 i.e. a data transference function and a clock pulse frequency conversion stopping function) in response to the count data $D_{CNT1}$, which it receives as input and sends the coefficient address and the shift data to an adder 24 and a shift control circuit 25, respectively.

During each frame, the number-of-corrections counter 22 counts the number of times counter 21 counts the maximum value, by counting carry signals $S_{CO}$ to generate number-of-corrections data $C_{HC}$, which is sent to a corrected value multiplier 26.

The corrected value multiplier 26 multiplies the $D_{HC}$ correction value ($=0.00396795$ (nsec)) determined in equation (6) by the number-of-corrections data $C_{HC}$, thereby producing the corrected value data $D_{HC}$ corresponding to a correction of the coefficient address $ADR_{COE}$ based on the number of corrections. The corrected value data $D_{HC}$ is supplied to the adder 24.

The adder 24 adds the coefficient address $ADR_{COE}$ and the corrected value data $D_{HC}$ to produce a corrected coefficient address $ADR_{COE1}$, which is provided to a coefficient adjusting circuit 27.

Figure 3:
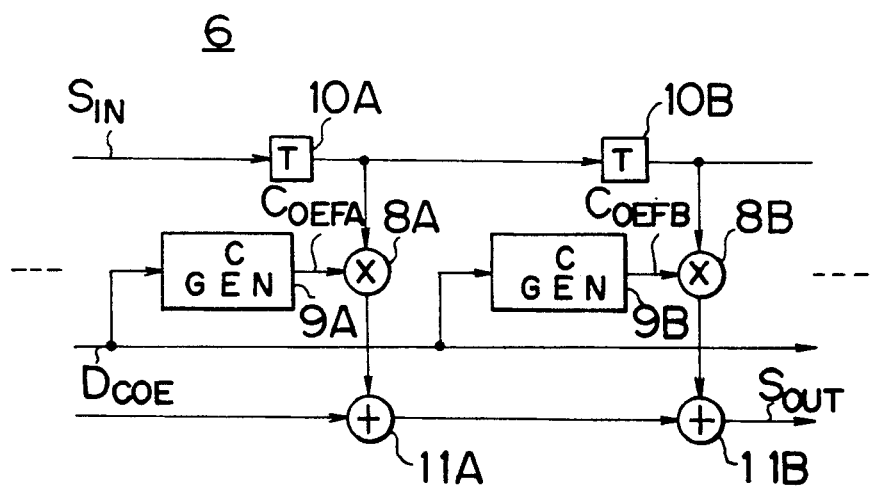
FIG. 3 is a block diagram showing part of the oversampling filter.
Figure 4:
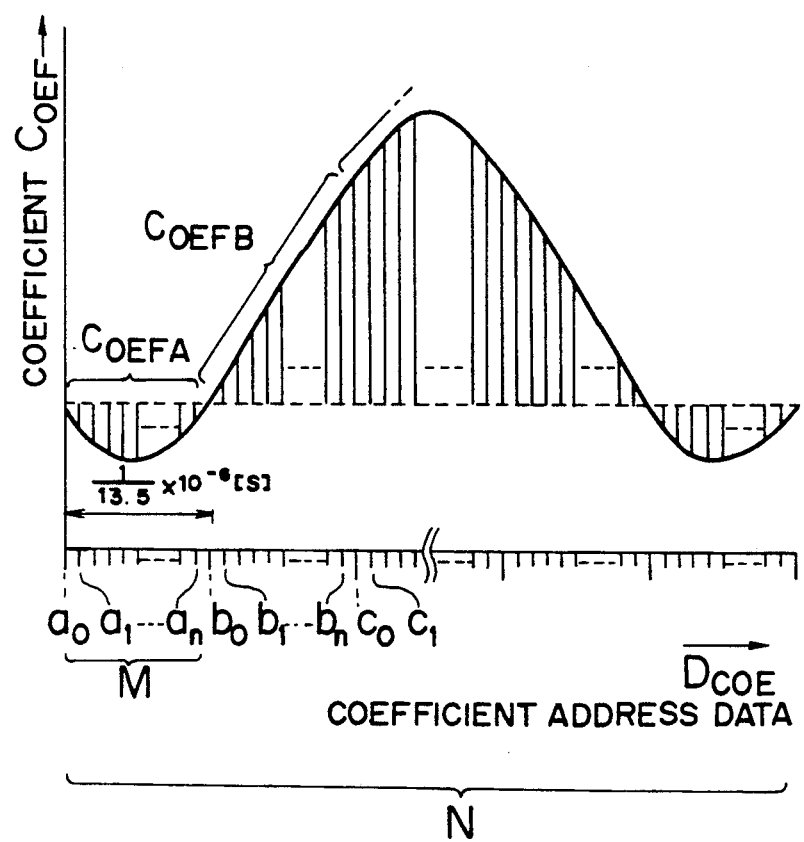
FIG. 4 is a graph showing the relationship between the coefficients and the coefficient address data.
Figure 5:
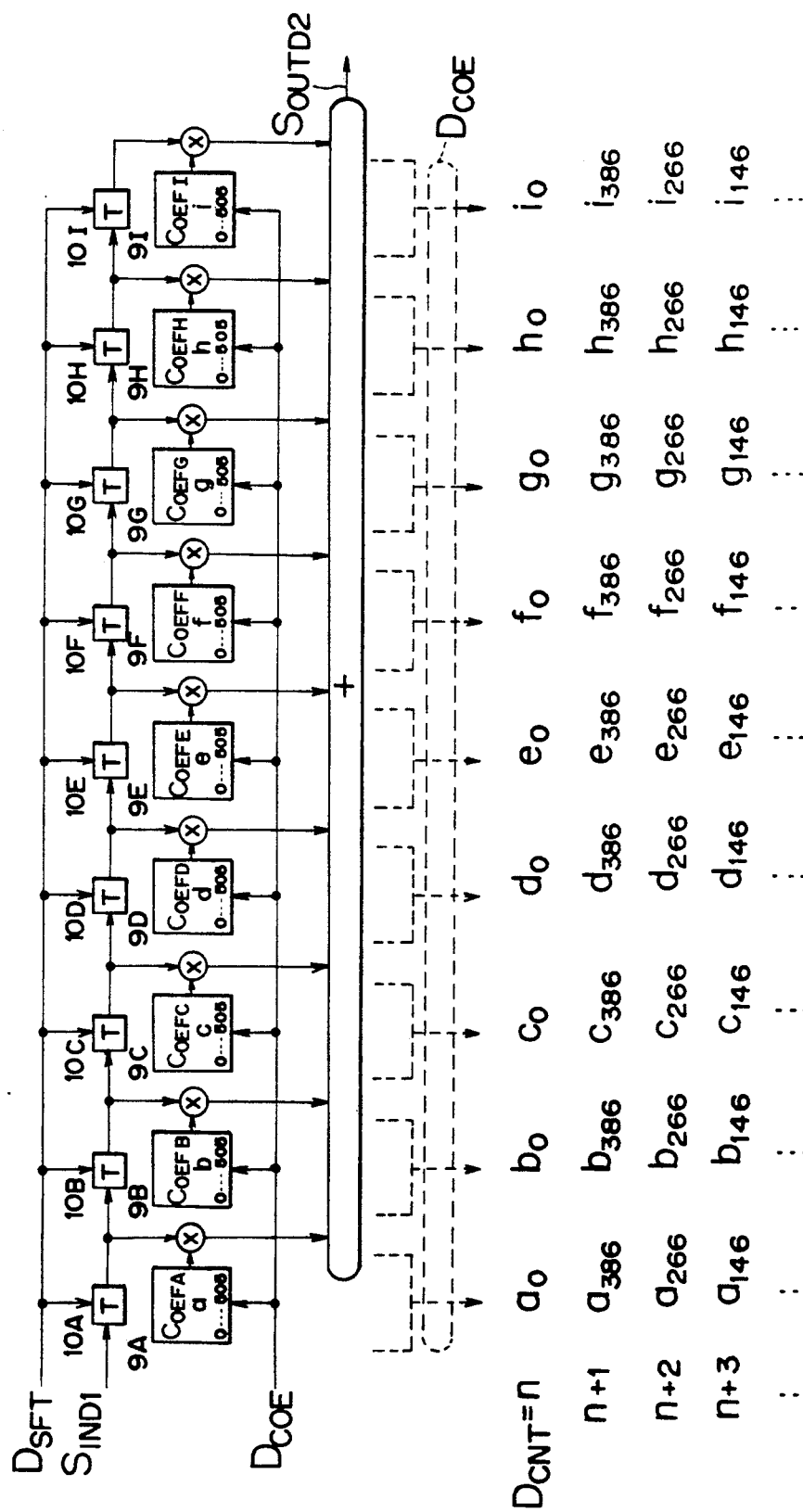
FIG. 5 is a schematic diagram showing the relationship between the count data and the coefficient address data.

On the basis of the corrected coefficient address $ADR_{COE1}$, this coefficient adjusting circuit 27 generates coefficient address data $D_{COE1}$ and sends it to the coefficient generating circuits 9A, 9B, ... (FIG. 3) of the oversampling filter 6.

Figure 7:
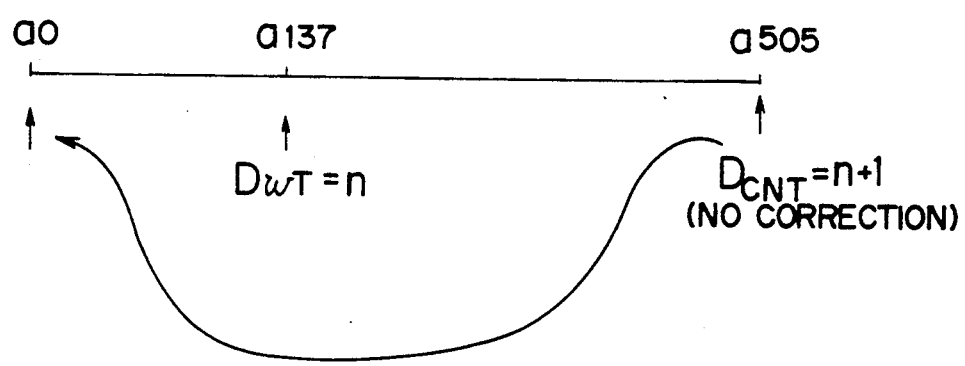
FIG. 7 is a schematic diagram showing the shift of the coefficient address data with the correction.

Moreover the coefficient adjusting circuit 27 detects whether or not the coefficient address $ADR_{COE1}$ is in an overflow condition resulting from the addition performed by adder 24, sending the result to the shift control circuit 25 as overflow data $D_{OF}$. The effect of the overflow is shown in FIG. 7. In FIG. 7, when the count data $D_{CNT}$ is $D_{CNT}=n$ the address $a_{137}$ is generated as the address of the coefficient data. When the count data $D_{CNT}$ becomes $D_{CNT}=n+1$ the address $a_0$ may be generated by means of a correction, whereas the address $a_{505}$ would be generated in the absence of a correction.

The overflow condition means that the address exceeds a round where the access of a round is from addresses $a_0$ to $a_{505}$. If an overflow is generated, therefore, it needs to be processed as follows. If there is an address relationship as in FIG. 7, the output data of the flip-flop circuit 10A which is to be multiplied by the coefficient having the address $a_0$ needs to further transfer data by one clock, despite the fact that the data transference would be stopped in the absence of the overflow condition. Thus, the operation "stop of data transference" and "stop of clock pulse frequency conversion" described above are inhibited when an overflow to address $a_0$ occurs.

The shift control circuit 25 detects whether or not there is the need for a "stop of data transference" and a "stop of clock pulse frequency conversion" and sends the resultant signals as shift control signals $S_{SFT2}$ to the timing adjusting circuit 2 and the oversampling filter 6.

Consequently, the timing adjusting circuit 2 controls the timing of sending the input 625/50 component digital video signals $S_{IND1}$ to the oversampling filter 6 according to the output clock pulse signals $CK_{D1}$, the output clock pulse signals $CK_{D2}$, and the shift control data $D_{SFT2}$.

The oversampling filter 6 performs oversampling by multiplying the 625/50 component digital video signals $S_{IND1}$ thus input by the coefficients $C_{OEFA}, C_{OEFB}, \ldots$ according to the shift control data $D_{SFT2}$ and the coefficient address data $D_{COE1}$, and conducts resampling according to the output clock pulse signals $CK_{D2}$ and outputs the resultant data. In this manner, there are obtained output digital video signals $S_{OUTD2}$ which are produced by converting the sampling frequency of 625/50 component digital video signals to the sampling frequency of PAL composite digital video signals.

The oversampling filter 6 has coefficients equal in number to a 505 times oversampling filter, and hence has a resolution of 1/505. In fact, the correction ($=0.00396795$ (nsec)) computed in equation (6) is 0.027068 times as large as the resolution. This value means that a correction is carried out 45 times (that is, a total correction 0.178 (nsec)) at the trailing end of one frame. To do this, the counter 21 and the number-of-corrections counter 22 are placed in initialized states by resetting them every frame.

According to the foregoing construction, sampling points are sequentially counted over a small range of 423 points, and the predetermined correction is carried out every 423 sampling points so as to synchronize the input signals $S_{IND1}$ and output signals $S_{OUTD2}$. The sampling rate converter 20 enables the counter circuit to be built with a simple circuit construction which counts from zero to 422, and which is capable of converting a sampling frequency of 625/50 component digital video signals to a sampling frequency of PAL composite digital video signals at a high accuracy.

Moreover, according to the foregoing construction, the coefficient address generation circuit 23 is also built with a simple circuit construction as a result of constructing the counter 21 with a simple circuit construction which counts from zero to 422. A sampling rate converter is thus realized which is capable of reducing the circuit scale to about 1/1677 of that of the conventional sampling rate converter 1 (FIG. 2), resulting in a remarkable reduction in overall size.

(3) Other Embodiments

In the embodiment above, the case in which a sampling frequency of 625/50 component digital video signals is converted to a sampling frequency of PAL composite digital video signals is described but this invention is not so limited. This invention is suitably applied to the case where a sampling frequency of PAL composite digital video signals is converted to a sampling frequency of 625/50 component digital video signals as well.

It is to be understood that in this case an effect similar to that of the preceding embodiment will be achieved by adding the correction (=0.00396795 (nsec)) described in equation (6) every 322 sampling points of a sampling cycle of 625/50 component digital video signals according to the principle of this invention based on equations (3) to (5).

In the preceding embodiments, cases where a sampling frequency of PAL composite digital video signals or of 625/50 component digital video signals is converted to a sampling frequency of 625/50 component digital video signals or PAL composite digital video signals, respectively, are described, but this invention is also not restricted to these. This invention may be suitably applied to various cases where a first sampling frequency of digital signals is to be converted to a second sampling frequency which is not in a relationship of a simple integer ratio with the first sampling frequency.

In the preceding embodiments, the case where 423 sampling points of a sampling cycle of PAL composite digital video signal are counted has been described, but this invention is not so limited. This invention may be suitably applied in the case where any integer multiple of 423 sampling points is counted.

While certain specifics have been described in connection with the preferred embodiments of the invention, it will be obvious to those skilled in the art that various changes and modifications may be made therein without departing from the invention, and it is intended, therefore, to cover in the appended claims all such changes and modifications as fall within the true spirit and scope of the invention.

What is claimed is:

1. In a sampling rate converter for converting a sampling frequency of digital signals sampled at a first sampling frequency to a second sampling frequency, and which includes an oversampling filter having coefficient generation means for generating coefficients to be provided to weighting means according to coefficient addresses; the combination of:
   means for generating clock pulses at said second sampling frequency;
   counting means for generating count data by counting, in response to said clock pulses, in a cyclic fashion from an initial value to a maximum value which is chosen on the basis of the first and second sampling frequencies;
   correction value generation means for generating a coefficient correction value in accordance with a number of times said counting means counts said maximum value, the value chosen as said maximum value, and the first and second sampling frequencies; and
   coefficient address generation means for generating each of said coefficient addresses in accordance with a respective value of said count data and the corresponding coefficient correction value generated by said correction value generation means.

2. A sampling rate converter according to claim 1, in which said correction value generation means includes:
   detection means for detecting said number of times the counting means counts said maximum value during a frame period; and
   multiplication means for multiplying said number detected by said detection means by a correction value based on said value chosen as said maximum value and said first and second sampling frequencies, thereby generating said coefficient correction value.

3. A sampling rate converter according to claim 2, in which said detection means for detecting said number of times said maximum value is counted includes a counter which is reset along with said counting means for counting said clock pulses by a signal representing a frame period corresponding to said first sampling frequency.

4. A sampling rate converter according to claim 1, in which said coefficient address generation means includes:
   means for generating an initial coefficient address and means for providing shift data based on said count data;
   addition means for adding said initial coefficient address and said coefficient correction value;
   coefficient adjusting means having means for generating said coefficient address based on an output of said addition means, means for detecting an overflow from said addition means, and means for outputting said coefficient address delayed for a cycle in response to detection of said overflow; and
   shift control means for modifying said shift data on the basis of said overflow.

5. A sampling rate converter according to claim 1, in which, at each said initial value of said count data, said digital signals sampled at said first sampling frequency are in synchronism with digital signals sampled at said second sampling frequency.

6. A sampling rate converter according to claim 1, in which said first sampling frequency is 13.5 Mhz, said second sampling frequency is 17.734475 MHz, and said maximum value is 423.

* * * * *